United States Patent
Tremlett et al.

(10) Patent No.: US 8,643,192 B2
(45) Date of Patent: Feb. 4, 2014

(54) INTEGRATED CIRCUIT PACKAGE WITH DISCRETE COMPONENTS SURFACE MOUNTED ON EXPOSED SIDE

(75) Inventors: Piers Tremlett, Coleford (GB); Michael Anthony Higgins, Caldicot (GB); Martin McHugh, Chepstow (GB)

(73) Assignee: Microsemi Semiconductor Limited (GB)

( * ) Notice: Subject to any disclaimer, the term of this patent is extended or adjusted under 35 U.S.C. 154(b) by 11 days.

(21) Appl. No.: 13/473,069

(22) Filed: May 16, 2012

(65) Prior Publication Data

US 2012/0292781 A1    Nov. 22, 2012

(30) Foreign Application Priority Data

May 19, 2011    (GB) .................................. 1108425.8

(51) Int. Cl.

| H01L 23/48 | (2006.01) |
|---|---|
| H01L 23/52 | (2006.01) |
| H01L 29/40 | (2006.01) |
| H01L 21/44 | (2006.01) |
| H01L 21/48 | (2006.01) |
| H01L 21/50 | (2006.01) |

(52) U.S. Cl.
USPC ............ 257/774; 257/E21.506; 257/E33.011; 438/121

(58) Field of Classification Search
USPC ............ 257/774, E21.506, E23.011; 438/121
See application file for complete search history.

(56) References Cited

U.S. PATENT DOCUMENTS

| 6,577,013 | B1* | 6/2003 | Glenn et al. ................... 257/777 |
|---|---|---|---|
| 8,076,782 | B2* | 12/2011 | Asai et al. ...................... 257/774 |
| 8,110,917 | B2* | 2/2012 | Hirose et al. ................... 257/697 |
| 2001/0038151 | A1* | 11/2001 | Takahashi et al. ............. 257/778 |
| 2004/0212030 | A1* | 10/2004 | Asai ................................ 257/432 |
| 2004/0219717 | A1* | 11/2004 | Takahashi et al. ............. 438/108 |
| 2005/0104187 | A1 | 5/2005 | Polsky et al. |
| 2005/0104228 | A1 | 5/2005 | Rigg et al. |
| 2009/0302435 | A1* | 12/2009 | Pagaila et al. .................. 257/659 |
| 2010/0027577 | A1* | 2/2010 | Dutta ............................. 372/50.1 |
| 2010/0090318 | A1 | 4/2010 | Hsu et al. |
| 2010/0123215 | A1* | 5/2010 | Pan et al. ....................... 257/532 |
| 2010/0148316 | A1* | 6/2010 | Kim et al. ...................... 257/621 |
| 2010/0164120 | A1* | 7/2010 | Nakayama et al. ............ 257/774 |
| 2010/0224977 | A1* | 9/2010 | Kim ................................ 257/686 |
| 2010/0252935 | A1* | 10/2010 | Lee et al. ....................... 257/774 |
| 2011/0045636 | A1 | 2/2011 | Chung |

(Continued)

FOREIGN PATENT DOCUMENTS

| WO | 2004059720 A1 | 7/2004 |
|---|---|---|
| WO | 2005104228 A1 | 11/2005 |
| WO | 2010059724 A2 | 5/2010 |

*Primary Examiner* — David S Blum
(74) *Attorney, Agent, or Firm* — Laubscher & Laubscher, P.C.

(57) ABSTRACT

An integrated circuit package has a host integrated circuit with an active front side that is surface-mounted on a support and an inactive back side. Conductive vias extend through the integrated circuit between the front and back sides. A redistribution layer on the back side of the host integrated circuit provides conductive traces and contact pads. The traces of the redistribution layer establish connection between the conductive vias and the contact pads. At least one additional component is surface-mounted on the back side of the host integrated circuit by electrical connection to the contact pads of the redistribution layer to provide a compact three-dimensional structure. In an alternative embodiment, the additional components can be mounted on the active side.

16 Claims, 2 Drawing Sheets

(56) References Cited

U.S. PATENT DOCUMENTS

| | | | |
|---|---|---|---|
| 2011/0063806 A1* | 3/2011 | Kariya et al. | 361/748 |
| 2011/0133333 A1* | 6/2011 | Kwon et al. | 257/737 |
| 2011/0316147 A1* | 12/2011 | Shih et al. | 257/737 |
| 2012/0018885 A1* | 1/2012 | Lee et al. | 257/738 |
| 2012/0049347 A1* | 3/2012 | Wang | 257/737 |

\* cited by examiner

INTEGRATED CIRCUIT PACKAGE WITH DISCRETE COMPONENTS SURFACE MOUNTED ON EXPOSED SIDE

FIELD OF THE INVENTION

This invention relates to the field of integrated circuits, and in particular to an integrated circuit package including one or more additional components.

BACKGROUND OF THE INVENTION

Integrated circuits, typically based on a silicon wafer, can be mounted on a printed circuit board along with other components, either active or passive. For example, it is known mount active and passive circuits on a printed circuit board as shown in FIG. 1, where the active sides face up and leads are taken down to the PCB.

An alternative solution is shown in FIG. 2 where the components are surface mounted on the PCB using so-called flip-chip technology. Here after fabrication, the integrated circuit (Chip) is flipped over and the active surface bonded to the PCB using solder balls pre-positioned on the contact pads.

Yet, another solution is shown in FIG. 3, where one chip, a passive circuit in this example, is mounted on top of an active circuit. The passive circuit is flip-chipped and surface-mounted on the underlying active circuit using solder balls. The top of the passive circuit is connected to the PCB by leads that are taken down to the PCB. Through-silicon-vias (TSVs) are formed through the passive circuit to connect it directly to corresponding locations on the active circuit.

The advantage of this arrangement is that it substantially reduces the footprint of the device. However, there are many discrete components, such as quartz crystals, surface acoustic wave filters, or other components that still need to be mounted on the PCB, thus substantially contributing to the overall footprint of the device.

US patent publication no. 2011/0045636 describes a method of stacking identical chips using through-silicon vias. However, this method does not eliminate the need to mount additional components as described above on the PCB.

SUMMARY OF THE INVENTION

Embodiments of the invention substantially reduce the footprint of the device by mounting additional passive components, such as quartz filters, surface acoustic devices, resistors, capacitors, inductors and the like, on the front or backside of the topmost integrated circuit, and connect to conductive traces, such as through-silicon-vias, extending through the integrated circuit.

Thus, according to the present invention an integrated circuit package comprising a host integrated circuit having front and back sides; conductive vias extending through the integrated circuit between the front and back sides; a redistribution layer on the front or back side of the host integrated circuit providing conductive traces and contact pads, and wherein the traces of the redistribution layer establish connection between the conductive vias and the contact pads; and at least one additional passive component surface-mounted on the host integrated circuit by electrical connection to the contact pads of the redistribution layer.

Not only does this arrangement substantially reduce the overall footprint of the package due to the three dimensional structure, the fact that the additional components are in closer proximity to the integrated circuits also allows better matching of the components.

The conductive traces may be directly surface mounted, for example, using solder balls, to contact pads on an underlying support, such as a printed circuit board, or may also be connected to the contact pads through a second redistribution layer.

It will be appreciated that orientation is arbitrary and the terms front, back, top etc. are merely used for convenience. Typically, in flip-chip technology, the integrated circuit is built up with the active (front side) facing up. Upon completion of the fabrication, the chip is flipped over so that the former back side (bottom side) becomes the topside and the former top (active) side becomes the bottom side. This then soldered to a printed circuit board using surface mount technology, wherein the contact pads on the integrated circuit are soldered to matching pads on the PCB. In one technique solder balls are provided on the PCB contact pads, and these are reflowed by the application of heat when the active surface of the integrated circuit has been applied to the PCB.

In one embodiment, the front side is active and surface mounted on a support, such as a printed circuit board, whereas the back side is inactive. In this embodiment, the backside of the flipped topmost integrated circuit, forming the host integrated circuit, acts as a substrate on which discrete components are surface mounted in much the same manner as if they were mounted on a PCB except because they are mounted on the chip itself the overall footprint of the package is substantially reduced.

In one embodiment, the topmost integrated circuit (chip) may be surface mounted on one or more additional integrated circuits to form a stack.

It is however possible to mount the additional components on the active upwardly facing side of the host integrated circuit. In this case the redistribution layer is applied in much the same way as the embodiment where it is mounted on the back side, and used to surface mount the additional discrete components.

In another aspect the invention provides a method of making an integrated circuit package, comprising forming conductive vias through a host integrated circuit between front and back sides thereof; forming a redistribution layer on the front or back side, wherein the redistribution layer provides conductive traces and contact pads, the conductive traces being electrically connected to the conductive vias; and surface mounting at least one additional component on the integrated circuit by electrical connection to the contact pads.

The method is normally carried out on a wafer containing multiple integrated circuits, which are subsequently diced into individual packages.

BRIEF DESCRIPTION OF THE DRAWINGS

The invention will now be described in more detail, by way of example only, with reference to the accompanying drawings, in which.

DETAILED DESCRIPTION OF THE INVENTION

Figure 1:
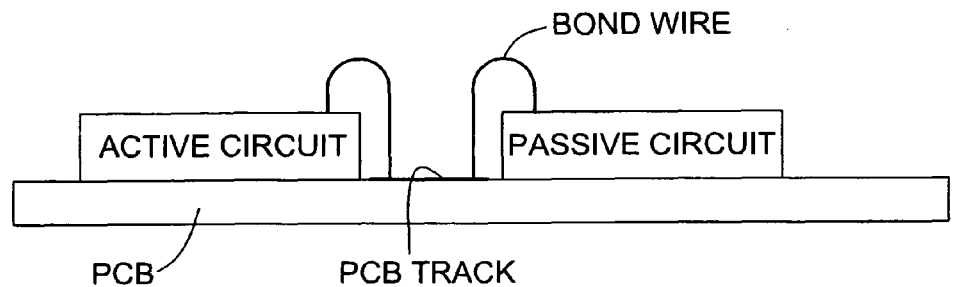
FIG. 1 shows a prior art arrangement of integrated circuits mounted on a printed circuit board.
Figure 2:
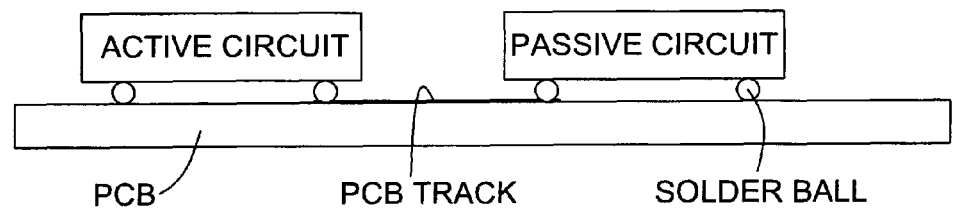
FIG. 2 shows an alternative prior art arrangement of integrated circuits.
Figure 3:
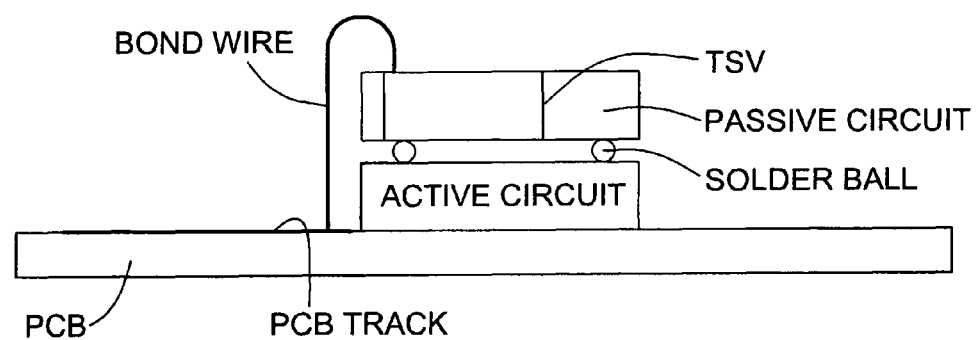
FIG. 3 shows another prior art arrangement.
Figure 4:
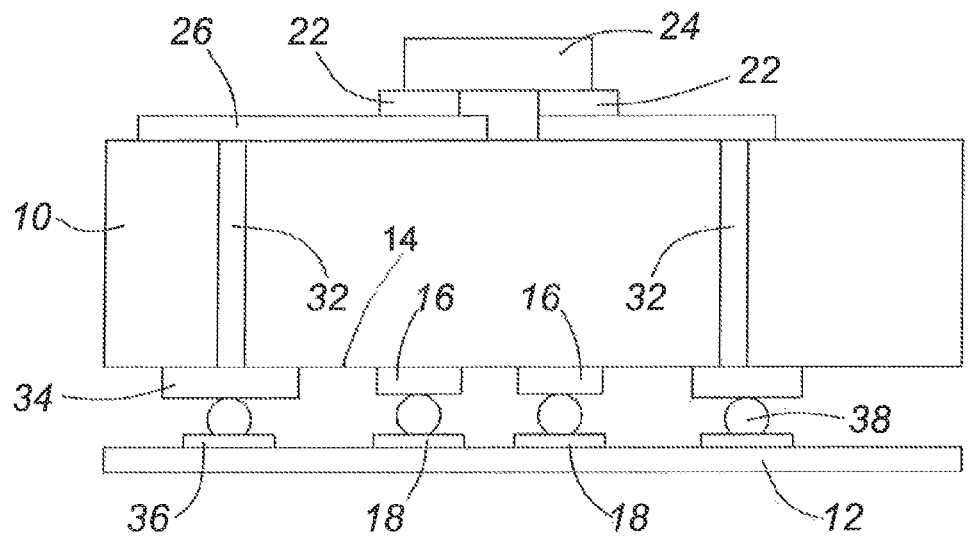
FIG. 4 shows an integrated circuit package in accordance with one embodiment of the invention.

FIG. 4 shows a host integrated circuit or chip 10, which in this embodiment is an active circuit based on a silicon wafer, hut it could also be a passive circuit, surface mounted on a printed circuit board (PCB) 12. The lower active side 14 of the integrated circuit has contact pads 16, which are soldered to matching pads 18 on the PCB 12 using solder balls 38 in a conventional manner for surface mount technology. The contact pads may typically be screen printed onto the backside of the host integrated circuit.

The backside (now the topside) of the host integrated circuit is normally inactive. In accordance with this embodiment of the invention a patterned redistribution layer 26 is formed on the backside of the wafer. This redistribution layer 26, in this example, comprises a lower insulating sublayer, made for example, of silicon oxide or silicon nitride, and an upper patterned sublayer providing conductive traces made, for example, of aluminum or copper. Other structures for the distribution layer are possible.

Contacts on additional component 24, which may be any suitable component, such as a quartz crystal, surface acoustic wave filter, etc. are soldered to the conductive traces of the redistribution layer by solder fillets 22.

The conductive traces are connected by through-silicon-vias (TSVs) 32 to contacts on the active surface of the integrated circuit. Since these may not match up with contact pads on the PCB 12, a second redistribution layer 34 also containing an insulating sublayer and conductive traces is provided on the active surface to lead the TSVs to contact pads 36 on the PCB 12.

The TSVs are made using known technology, and may, for example, be made of copper.

It will be seen that in accordance with embodiments of the invention, the backside of the topmost wafer effectively acts as a printed circuit board for the mounting of additional discrete components. The redistribution layer allows the components to mounted in substantially the same manner as they would be mounted on a PCB.

FIGS. 5a to 5d shows the steps in the manufacture of one embodiment of the package. First a redistribution layer 50, 51 is deposited on the both sides of a wafer typically including a number of integrated circuits (chips) 52, which is formed of a silicon wafer. The redistribution layer consists of an insulating layer 50a, 51a, such as silicon oxide or nitride, in contact with the surface of the chip and traces 50b, 51b, made of copper or aluminum patterned to provide the requisite connections. The patterning is done using conventional masking and photolithography techniques.

Next the through-silicon-vias 57 are formed through the wafer as described, for example, in US patent publication no. 2011/0045636.

Next the solder fillets 53 on placed on the contacts on the backside of the wafer. After the discrete components 54 are positioned, the solder is reflowed to solder them in place in a surface mounted manner. It will be appreciated that the traces of the redistribution layer 50 not only connect the contacts on the components to the through-silicon vias 57, but also as interconnects, interconnecting the discrete components mounted on the backside of the ship in much the same manner as a conventional printed circuit board.

After mounting the components on the backside of the chip, the solder balls 56 can be placed on the active side of the chip, and after placing the whole assembly on the PCB (not shown) the solder balls 56 are reflowed to attach the assembly to the PCB.

The chips can be stacked in the manner described in the above US patent publication prior to attaching the discrete components on the backside of the topmost chip. In this arrangement, the discrete components are mounted on backside of the topmost chip acting as a PCB. The TSVs, extend right through the stack in a similar manner to that shown in the above US patent publication.

Figure 5A:
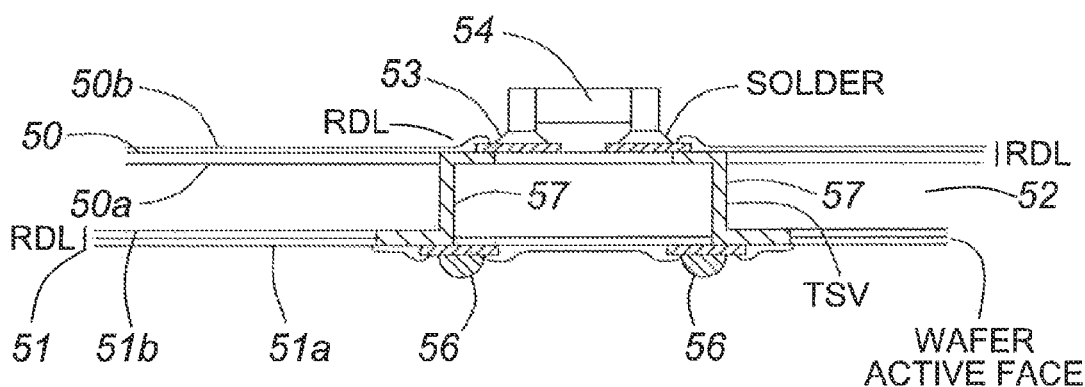
FIGS. 5a to 5c illustrate the steps in making an integrated circuit package in accordance with one embodiment of the invention.
Figure 5B:
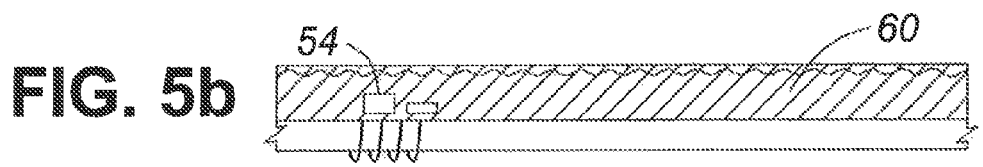

The additional components 54 can optionally be embedded in a plastic molding 60 as shown in FIG. 5a. This can be subjected to a stress relief step as required.

Figure 5C:
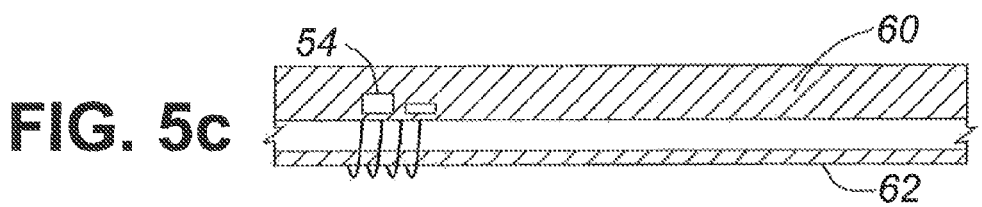

Finally, as shown in FIG. 5c, the lower side can also be embedded in a plastic molding 62.

The wafer can then be sawn into individual units where multiple packages are made at the same time.

There are various alternative embodiments. For example, either the passive or active silicon wafers could also be germanium, gallium arsenide, indium phosphide, silicon carbide or any other semi-conducting material. The added components could be any passive or active device that has not been integrated in either of the circuits. The additional components could be soldered to a silicon wafer that could be all passive, all active, a combination two circuits connected together or a single circuit.

If a power dissipating component is added then the host material could act as a heat-sink. In place of solder a conductive epoxy or other conductive attachment material, such as conductive glues, films or polymers, could be used. Soldering of additional components can be by solder print, solder balls or any other method of interconnection.

Although the invention has been described in relation to a host integrated circuit wherein the additional components are mounted on the back side, it will be appreciated that in certain applications it may be desirable to mount them on the active front side, which in this case would face upwardly. The redistribution layer is in this case applied to the front face, and then the additional components are surface mounted on the redistribution layer. A second redistribution layer on the underside of the chip can be provided if necessary to connect the exposed conductive traces to contact pads on the supporting printed circuit board.

Additional components could be flip chip mounted to the host circuit. Additional components may be soldered to an active circuit with no integrated passive circuit.

Additional components may be soldered to a passive circuit with no integrated active circuit. There may be several layers of active and/or passive circuits to which surface mount components are added.

The invention claimed is:

1. An integrated circuit package comprising:
    a host integrated circuit having an active front side and an inactive back side, one of said front and back sides being surface-mounted on an underlying support selected from the group consisting of a printed circuit board and an underlying integrated circuit, and the other of said front and back sides providing an exposed side;
    conductive vias extending through the host integrated circuit between the front and back sides thereof;
    a first redistribution layer on the exposed side of the host integrated circuit providing conductive traces and contact pads; and
    a plurality of discrete components, each of said discrete components being surface-mounted on the exposed side of the host integrated circuit by electrical connection to the contact pads of the redistribution layer; and
    said conductive traces of the first redistribution layer establishing connection between the conductive vias and the contact pads and providing interconnects interconnecting said discrete components.

2. An integrated circuit package as claimed in claim 1, wherein the front side of the host integrated circuit is surface-mounted on the underlying support.

3. An integrated circuit package as claimed in claim 1, wherein the underlying support is formed by one or more additional integrated circuits arranged such that the integrated circuits form a stack with the topmost integrated circuit of the stack forming the host integrated circuit and the bottommost integrated circuit surface-mounted on a printed circuit board.

4. An integrated circuit package as claimed in claim 1, wherein the first redistribution layer includes a sub passivation layer and a patterned conductive sublayer forming the traces and conductive pads.

5. An integrated circuit package as claimed in claim 1, wherein the discrete components are surface-mounted by solder connections to the contact pads forming part of the first redistribution layer.

6. An integrated circuit package as claimed in claim 1, wherein the host integrated circuit has a silicon substrate and the vias are through-silicon-vias.

7. An integrated circuit package as claimed in claim 2, further comprising a second redistribution layer on the front side of the host integrated circuit, and wherein said second redistribution layer provides interconnection between conductive traces on the front side of the host integrated circuit and contact pads on the underlying support.

8. An integrated circuit package as claimed in claim 1, wherein the discrete components are embedded in a plastic molding on the exposed side of the host integrated circuit.

9. A method of making an integrated circuit package, comprising: surface mounting one of an active front side and an inactive back side of a host integrated circuit on an underlying support selected from the group consisting of a printed circuit board and an underlying integrated circuit, the other of said active front side and inactive back side providing an exposed side;
  forming conductive vias through the host integrated circuit between the front and back side thereof;
  forming a first redistribution layer on the exposed side to provide conductive traces and contact pads, the conductive traces being electrically connected to the conductive vias;
  surface mounting each of a plurality of discrete components on the exposed side by electrical connection to the contact pads of the first redistribution layer, said conductive traces of the first redistribution layer establishing connection between the conductive vias and the contact pads and providing interconnects interconnecting said discrete components.

10. A method as claimed in claim 9, wherein the front side of the host integrated circuit is surface mounted on the underlying support.

11. A method as claimed in claim 9, wherein the front side of the host integrated circuit is surface mounted directly onto a printed circuit board.

12. A method as claimed in claim 10, wherein the front side of the host integrated circuit is surface mounted onto another integrated circuit so as to form a stack of integrated circuits, which in turn are surface mounted on a printed circuit board.

13. A method as claimed in claim 9, wherein after forming the first redistribution layer, solder balls are placed onto the contact pads, the discrete components are positioned on the exposed side of the host integrated circuit, and the solder balls are then subjected to a reflow process to secure the discrete components.

14. A method as claimed in claim 9, wherein the host integrated circuit has a silicon substrate, and the vias are formed as through-silicon vias.

15. A method as claimed in claim 10, further comprising providing a second redistribution layer on the front side of the host integrated circuit, and wherein said second redistribution layer provides interconnection between conductive traces on the front side and contact pads on the underlying support.

16. A method as claimed in claim 9, further comprising the step of forming a plastic molding around the discrete components.

* * * * *